(12) United States Patent
Keshavarzi et al.

(10) Patent No.: US 6,181,608 B1
(45) Date of Patent: Jan. 30, 2001

(54) DUAL VT SRAM CELL WITH BITLINE LEAKAGE CONTROL

(75) Inventors: Ali Keshavarzi; Kevin Zhang, both of Portland; Yibin Ye, Hillsboro; Vivek K. De, Beaverton, all of OR (US)

(73) Assignee: Intel Corporation, Santa Clara, CA (US)

(*) Notice: Under 35 U.S.C. 154(b), the term of this patent shall be extended for 0 days.

(21) Appl. No.: 09/261,915

(22) Filed: Mar. 3, 1999

(51) Int. Cl.[7] .................................................. G11C 11/34
(52) U.S. Cl. ........................ 365/188; 365/184; 365/182; 365/156; 365/154
(58) Field of Search .................................... 365/156, 145, 365/154, 184, 182, 188

(56) References Cited

U.S. PATENT DOCUMENTS

| | | | |
|---|---|---|---|
| 5,020,029 | 5/1991 | Ichinose et al. ...................... | 365/154 |
| 5,153,852 | * 10/1992 | Terrell ................................. | 365/154 |
| 5,222,039 | * 6/1993 | Vinal ................................... | 365/156 |
| 5,452,246 | 9/1995 | Kawashima ......................... | 257/391 |
| 5,461,713 | * 10/1995 | Pasucci ............................... | 365/190 |
| 5,471,421 | * 11/1995 | Rose et al. .......................... | 365/182 |
| 5,583,821 | 12/1996 | Rose et al. .......................... | 365/226 |
| 5,732,015 | * 3/1998 | Kazerounian et al. .............. | 365/154 |
| 5,790,452 | * 8/1998 | Lien .................................... | 365/154 |
| 5,790,461 | * 8/1998 | Holst .............................. | 365/189.04 |
| 5,828,597 | * 10/1998 | Madan ................................ | 365/156 |
| 5,837,573 | * 11/1998 | Guo .................................... | 438/238 |
| 5,939,762 | 8/1999 | Lien .................................... | 365/154 |

FOREIGN PATENT DOCUMENTS

403290893 * 12/1991 (JP) .

OTHER PUBLICATIONS

I. Fukushi et al., "A Low–Power SRAM Using Improved Charge Transfer Sense Amplifiers and a Dual–Vth CMOS Circuit Scheme," 1998 Symposium on VLSI Circuits Digest of Technical Papers, Jun. 11, 1998, pp. 142–145.

Y. Nakagome, "Voltage Regulator Deisgn for Low Voltage DRAMs," Memory Design and Evolution, 1998 VLSI Memory Short Course, 1998 Symposium on VLSI Circuits, Jun. 10, 1998, pp. 1–40 (especially p. 37).

* cited by examiner

*Primary Examiner*—Viet Q. Nguyen
(74) *Attorney, Agent, or Firm*—Alan K. Aldous

(57) ABSTRACT

In some embodiments, the invention includes an integrated circuit including a bitline and a bitline#, wordlines, and memory cells. The memory cells each corresponding to one of the wordlines and each include first and second pass transistors coupled between first and second storage nodes, respectively, and the bitline and bitline#, respectively, the corresponding wordline being coupled to gates of the first and second pass transistors. The memory cells include first and second inverters cross-coupled between the first and second storage nodes, wherein the first and second pass transistors each have a lower threshold voltage than do transistors of the first and second inverters. Wordline voltage control circuitry coupled to the wordlines selectively controls wordline signals on the wordlines. In some embodiments, the wordline voltage control circuitry asserts the wordline signal for a selected wordline corresponding to a memory cell selected to be read and underdrives the wordline signals for the wordlines not corresponding to the selected memory cell.

24 Claims, 3 Drawing Sheets

DUAL VT SRAM CELL WITH BITLINE LEAKAGE CONTROL

BACKGROUND OF THE INVENTION

1. Technical Field of the Invention

The present invention relates to integrated circuits and, more particularly, to memory cells with dual threshold voltages and bitline leakage control.

2. Background Art

Static random access memory (SRAM) cells typically provide memory storage for bits that can be rapidly read from and written to. A typical SRAM cell has six field effect transistors (FET transistors). Two of the FET transistors form a first inverter and two of the FET transistors form a second inverter, between power and ground terminals. The first and second inverters are cross-coupled such that at a first storage node, the output of the second inverter is tied to the input of the first inverter, and at a second storage node, the output of the first inverter is tied to the input of the second inverter. The first and second cross-coupled inverters form latched wherein one of the storage nodes is pulled low and the other storage node is pulled high. The other two of the six transistors are pass FET transistors controlled by a wordline signal on a wordline conductor. One of the pass transistors is coupled between a bitline and the first storage node. The other pass transistor is coupled between a bitline# and the second storage node. With the pass transistors off, the first and second storage nodes are insulated from the bitline and bitline#, although there may be some leakage.

In a reading procedure, data and data# signals are precharged high on the bitline and bitline#, respectively. When the wordline is asserted, one of the storage nodes is low and the other is high. The low storage node begins to pull either the data or data# signal low depending on the state of the memory cell. A sense amplifier senses a difference between the data and data# signals and accelerates the fall of whichever of the data or data# signals corresponds to the low storage node until the storage node is low. The high storage node remains high and the sense amplifier may pin the storage node high through the data or data# signal (depending on the state of the memory cell). Accordingly, the reading procedure causes the storage nodes to remain at the same logic states after the wordline signal is de-asserted. The sense amplifier provides a signal indicative of the state.

In a writing procedure, circuitry in a sense amplifier causes one of the data or data# signals to be high and the other to be low in response to whether a high or low value has been written into a write buffer. When the wordline signal is asserted, if the current state of the first and second storage nodes is the same as that of the data and data# signals, then the first and second storage nodes remains the same. If the current state of the first and second storage nodes is different than that of the data and data# signals, one of the storage nodes is pulled down while the other storage node is pulled up. When the states of the first and second storage nodes in the latch formed of the two cross-coupled inverters changes, the latch is said to flip states.

Unlike dynamic random access memory (DRAM) cells, SRAM cells are not required to be refreshed to maintain their state. Rather, as long as the power is supplied to the power terminal and absent leakage, the voltage states of the first and second storage nodes are stable in the latch of the cross-coupled inverters.

However, to a greater or lesser extent, leakage is present in SRAM cells. To keep leakage low, the threshold voltages are kept relatively high. For example, the threshold voltages of transistors of the memory cells may be higher than for transistors of other portions of the integrated circuits containing the memory cells. However, keeping the threshold voltage high also decreases the switching speed and cache performance. Accordingly, there is a need for a structure and technique that allows for memory cells with low leakage and fast access.

SUMMARY

In some embodiments, the invention includes an integrated circuit including a bitline and a bitline#, wordlines, and memory cells. The memory cells each corresponding to one of the wordlines and each include first and second pass transistors coupled between first and second storage nodes, respectively, and the bitline and bitline#, respectively, the corresponding wordline being coupled to gates of the first and second pass transistors. The memory cells include first and second inverters cross-coupled between the first and second storage nodes, wherein the first and second pass transistors each have a lower threshold voltage than do transistors of the first and second inverters. Wordline voltage control circuitry coupled to the wordlines selectively controls wordline signals on the wordlines.

In some embodiments, the wordline voltage control circuitry asserts the wordline signal for a selected wordline corresponding to a memory cell selected to be read and underdrives the wordline signals for the wordlines not corresponding to the selected memory cell.

BRIEF DESCRIPTION OF THE DRAWINGS

The invention will be understood more fully from the detailed description given below and from the accompanying drawings of embodiments of the invention which, however, should not be taken to limit the invention to the specific embodiments described, but are for explanation and understanding only.

DETAILED DESCRIPTION

Figure 1:
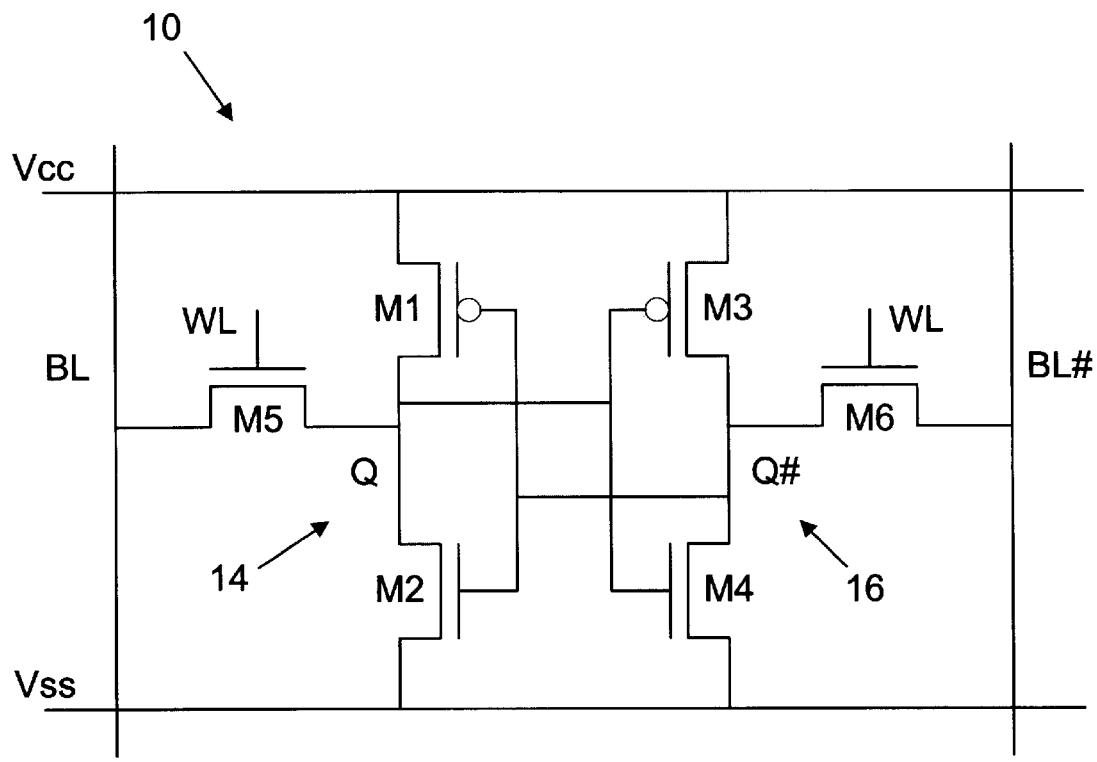
FIG. 1 is a schematic representation of a memory cell according to some embodiments of the invention.

FIG. 1 illustrates an SRAM memory cell 10 according to some embodiment of the invention. Memory cell 10 is representative of other memory cells described and illustrated in block diagram form below. However, the invention is not limited to a memory cells having the details of memory cell 10. The FET transistors described herein may be metal oxide semiconductor field effect transistors (MOSFETs).

The invention involves a memory system having memory cells wherein pass transistors have lower threshold voltages (Vt) than do latch transistors, and wherein wordlines for non-selected memory cells are underdriven to reduce leakage in bitlines and bitlines#.

Referring to FIG. 1, a first inverter 14 includes a pFET transistor M1 and an NFET transistor M2 and has an output at a first storage node Q and an input at a second storage node Q#. Ordinarily, when storage node Q has a logic low voltage, storage node Q# has a logic high voltage and vice versa. A second inverter 16 includes a pFET transistor M3 and an nFET transistor M4 and has an output at storage node Q# and an input at storage node Q. First and second inverters 14 and 16 are cross-coupled between the first and second storage nodes because the output of the inverter 14 is tied to the input of inverter 16 and the output of inverter 16 is tied to the input of inverter 14. This cross-coupled arrangement forms a latch. Transistors M1 and M3 are pull-up transistors and M2 and M4 are pull down transistors. Inverters 14 and 16 are coupled between a power supply voltage Vcc (sometimes called Vdd) and a ground voltage Vss, which is not necessarily earth ground.

A first pass transistor M5 is an nFET transistor coupled between a bitline (BL) and storage node Q. A second pass transistor M6 is an NFET transistor coupled between a bitline# (BL#) and storage node Q#. The gates of the pass transistors M5 and M6 are driven by a wordline signal on a wordline. Data and data# signals are on the bitline and bitline#, respectively. For convenience, the data and data# signals are referred to herein as bit signals.

In some embodiments, memory cell 10 is considered to have a logic high state when Q is high (1) and Q# is low (0), and a logic low state when Q is low (0) and Q# is high (1). In other embodiments, the opposite is the case.

The terms "some embodiments" and "other embodiments" mean that at least some embodiments of the invention include the structure, function, or characteristic referred to in connection with the term. Further, the different references to "some embodiments" are not necessarily all referring to the same embodiments.

The following describes a reading procedure according to some embodiments of the invention. However, the invention is not restricted to the following details. The data and data# signals are precharged high (although alternatively they could be precharged low or to another reference voltage). When the wordline signal is asserted, pass transistors M5 and M6 are turned on. One of the storage nodes is low (i.e., has a logic low voltage) and the other is high (i.e., has a logic high voltage). The storage node that is low starts to pull the corresponding bit signal low (either the data or data# signal depending on the state of the memory cell). A sense amplifier accelerates senses and amplifies the fall of the corresponding bit signal and may also pin the other bit signal high. The sense amplifier does not begin to accelerate the fall until the difference in the data and data# signals is as great or greater than a particular voltage. That voltage will vary depending on the sense amplifier chosen. The present invention is not limited to any particular sense amplifier.

As an example, if storage node Q is high and storage node Q# is low, when the wordline signal is asserted, storage node Q# starts to pull the data# signal low, while the data signal remains high. The sense amplifier accelerates the pulling down of the data# signal. The storage node Q remains high and storage node Q# remains low after the wordline is deasserted. The sense amplifier provides a signal indicating the state of the memory cell. Similarly, if storage node Q is low and storage node Q# is high, when the wordline is asserted, storage node Q starts to pull the data signal low, while the data# signal remains high. The sense amplifier accelerates the pulling down of the data. When the wordline is de-asserted, storage nodes Q and Q# remain low and high, respectively.

In a writing procedure, to write a bit into memory cell 10, circuitry (e.g., in FIG. 3) causes one of the data or the data# signals to be high and the other low depending on the state that it is desired to write into memory cell 10. When the wordline signal is asserted, pass transistors M5 and M6 are turned on and storage nodes Q and Q# either keep the same logic states or change states depending on whether storage nodes Q and Q# are the same as or different than the data and data# signals, respectively. Although the latch formed by inverters 14 and 16 provides positive feedback to keep storage nodes Q and Q# stable, the latch flips states of Q and Q# when the data and data# signals are opposite that of storage nodes Q and Q#.

Figure 2:
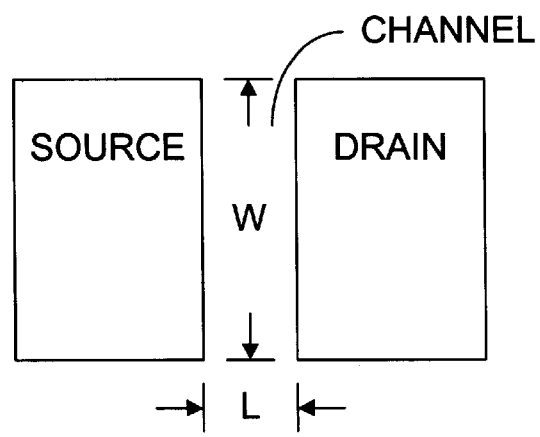
FIG. 2 illustrates channel length and width dimensions.

The sizes and threshold voltages (Vts) of transistors M1–M6 can be chosen to achieve a trade off of size, stability, and switching speed. FIG. 2 illustrates the source, channel, and drain of a transistor, which may represent any of transistors M1–M6. The transistor has a channel width W and a channel length L. The switching speed of a FET transistor is related to W/L. The switching speed increases as W increases and/or L decreases. The switch switches decreases as W decreases and/or L increases. However, the area of a transistor also increases areas as W and/or L increases and the area decreases as W and/or L decreases. A smaller area of the transistor is desirable.

In some embodiments, memory cell 10 is fabricated such that the threshold voltages (Vt) of transistors M5 and M6 are less than the Vt of transistors M1–M4. With a lower Vt, transistors M5 and M6 will switch faster allowing faster reading and writing access to storage nodes Q and Q#. However, transistors M5 and M6 will also be leakier. The leakage of the memory cells not selected can potentially offset some of the speed advantage on the differential signal development. Further, leakage can change the state stored in the memory cell. As described below, in some embodiments, the wordline signals of the cells not selected for reading or writing can be underdriven to reduce the leakage of the cells. In this way, they will (1) have a very small level of leakage so as to not change the state of storage nodes Q and Q# and (2) not effect the bitline and bitline# in such a way that would erroneously alter the reading or writing of a selected cell.

The following describes a method of design that may be used for some embodiments. A reference cell may be chosen with a high Vt for transistors M1–M6 and with transistor W and L for M1–M6 chosen for stability. Then, the threshold voltages of M5 and M6 are lowered to increase access speed. The W and/or L of M1–M4 and perhaps also the W and/or L of M5–M6 are then resized to maintain a stability the same or similar to that of the reference cell. Speed and area may also be a consideration in sizing. In some embodiments, the pull up and pull down transistors M1–M4 are designed to be slightly wider than would be optimum if transistors M1–M6 have the same Vt. This leads to better stability (read stability) at the price of lightly larger area. Area trade-off may be reduced by more aggressive design rules as processing technology improves. Larger nFET pull down devices also help speed by providing a current sink and avoid charge build up.

The lower Vt may be obtained through process techniques such as an extra implant step or the application of a forward body bias to transistors M5 and M6. Another technique to 5 effectively achieve a lower Vt is to overdrive the gate of pass transistors M5 and M6 while fabricating them at a higher Vt, which Vt may be the same as for transistors M1–M4. In some embodiments, the invention provides greater than a 25% increase in access speed compared to that of the reference cell.

Figure 3:
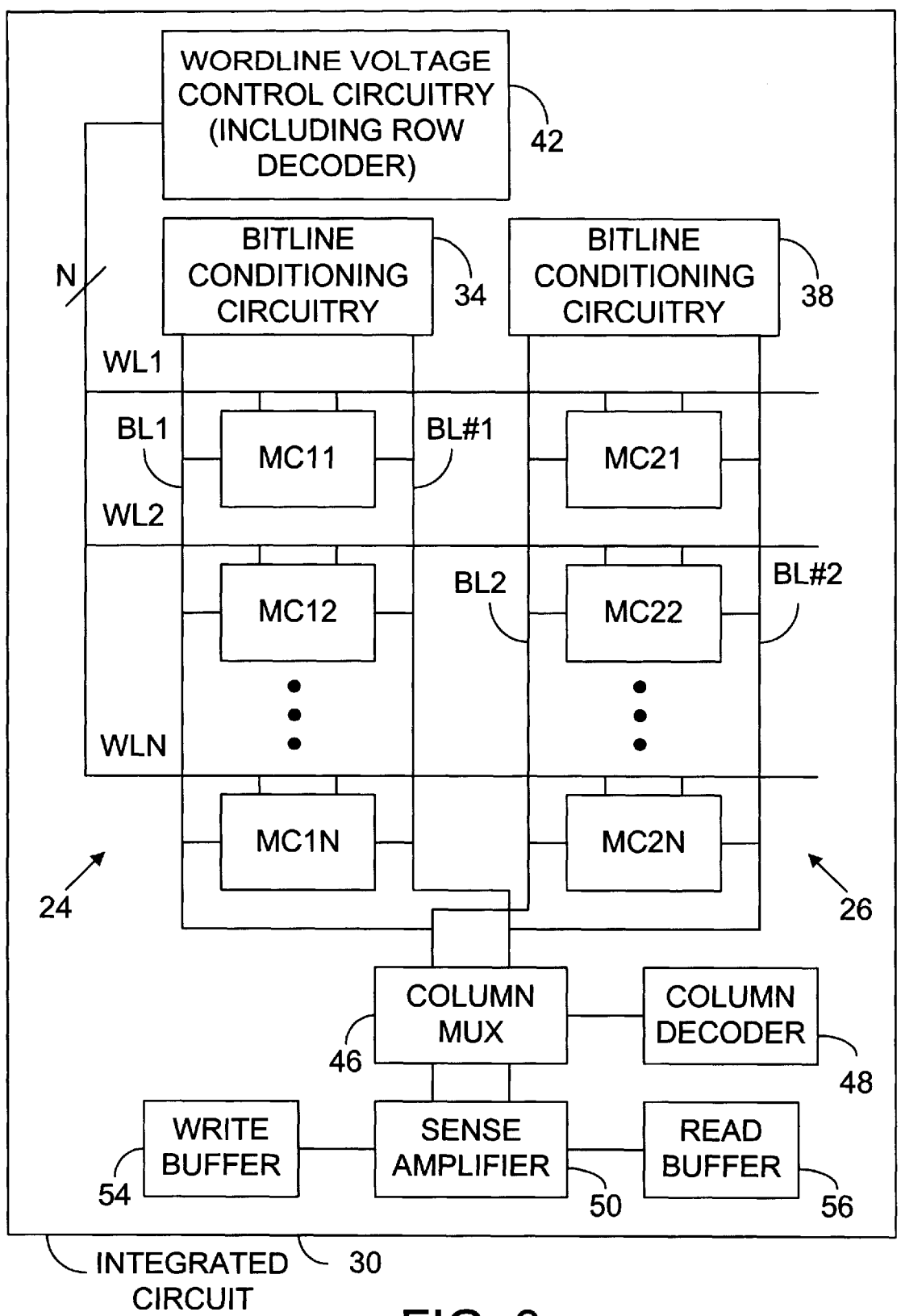
FIG. 3 is a schematic representation of an integrated circuit including a memory system according to some embodiments of the invention.

Referring to FIG. 3, an integrated circuit 30 includes a memory system 34. Of course, integrated circuit 30 would include a variety of other circuits. Some or all of the other circuits may have transistors that have the same or different threshold voltages as compared to transistors M1–M4. Integrated circuit 30 may be a processor, such as a microprocessor or digital signal processor having a cache memory, a stand alone memory chip, or various other types of chips including an application specific integrated circuit (ASIC).

Memory system 34 includes columns of memory cells, of which illustrated first and second columns 24 and 26 are representative. First column 24 includes memory cells MC11, MC12, . . . MC1N, and second column 26 includes memory cells MC21, MC22, . . . MC2N. Each of the memory cells may have the same structure as memory cell 10 of FIG. 1, or may have a somewhat different structure. Bitline conditioning circuitry 34 is used to precharge bitlines BL1 and BL#1. Bitline conditioning circuitry 38 is used to precharge bitlines BL2 and BL#2. Wordline voltage control circuitry 42 (which may include a row decoder) controls the wordline signals on wordlines conductors WL1, WL2, . . . WLN. As described below, a sense amplifier 50 senses the difference in the data and data# signals in a reading procedure and controls the states of the data and data# signals in a writing procedure for both columns 24 and 26 through a column multiplexer 46 under control of a column decoder 48. There may be one sense amplifier for every so many columns or (as in FIG. 4) a single sense amplifier per column.

The following describes a reading procedure according to some embodiments. Bitline conditioning circuitry 34 and 38 precharge the data and data# signals on bitlines BL1, BL#1, BL2 and BL#2. (Alternatively, only the data and data# signals of the column of interest is precharged.) After the wordline signal is asserted on the wordline of interest (WL1, WL2, . . . WLN), the corresponding pass transistors M5 and M6 are turned on. The storage node that is low starts to pull the corresponding bit signal (data or data#) low. The other bit signal remains high. Sense amplifier 50 senses and amplifies a difference in the data and data# signals and accelerates the fall of the bit signal corresponding to the low storage node. The sense amplifier may also pin the other bit signal high. Sense amplifier 50 provides a signal to read buffer 56 indicative of the state of the memory cell of interest.

For example, assume memory cell MC11 is to be read and in MC11, storage node Q is high and storage node Q# is low. Wordline voltage control circuitry 42 asserts (high) the wordline signal on the WL1, while the wordline signals on the WL2, WL3, and WL4 conductors are underdriven. With transistors M6 turned on, the storage node Q# would start to pull the data# signal low. When sense amplifier 44 senses a difference in the data and data# signals, it accelerates the fall of the data# signal and may pin the data signal high. When the wordline signal on the WL1 conductor is deasserted, pass transistors MS and M6 would be turned off and the states of storage nodes Q and Q# would remain what they were before the reading. Under the convention listed above, sense amplifier 50 may provide a high bit signal to read buffer 56 representing the state of MC11.

The following describes a writing procedure according to some embodiments. However, the invention is not limited to these details. Sense amplifier 50 controls which of the data and data# signals of the selected column is high and which is low in response to a bit in write buffer 54. Column decoder 48 selects the column. For example, if the bit is high, in some embodiments, sense amplifier 50 causes the data signal on the bitline of the selected column to be high and the data# signal on the bitline# to be low. The correct wordline is asserted so that pass transistors MS and M6 are on. If the states of the storage nodes and the same as the states of the data and data# signals, the states of the storage nodes remains the same and the state stored in the memory remains the same. If the states of the storage nodes is the opposite of the states of the data and data# signals, the states of the storage nodes Q and Q# are switched and the latch flips states. In some embodiments, the wordlines of the non-selected rows are underdriven. In other embodiments, the wordlines of the non-selected rows are not underdriven.

As mentioned above, the lower Vt of pass transistors MS and M6 can induce some extra bitline and/or bitline# leakage, which can potentially offset some of the speed advantage on the differential signal development required for sensing. The is particularly a problem in the reading procedure. In the case of FIG. 3, where memory cells are coupled to a bitline and bitline# and the difference in voltage is sensed by a sense amplifier, the leakage through the pass transistors can be an issue. When the data and data# are precharged high, leakage is a concern between either bitline or bitline# and a storage node that is low (that is, where there is a voltage drop between the source and drain of the pass transistor). From a sensing view point, the leakage is the least significant when the cells are evenly divided between storing a logic high and a logic low. The reason is that approximately the same current is leaking to the bitline and bitline#. (Of course, the leakage is a concern with respect to storage nodes changing states and power consumption regardless of how lows and highs are distributed.)

Figure 4:
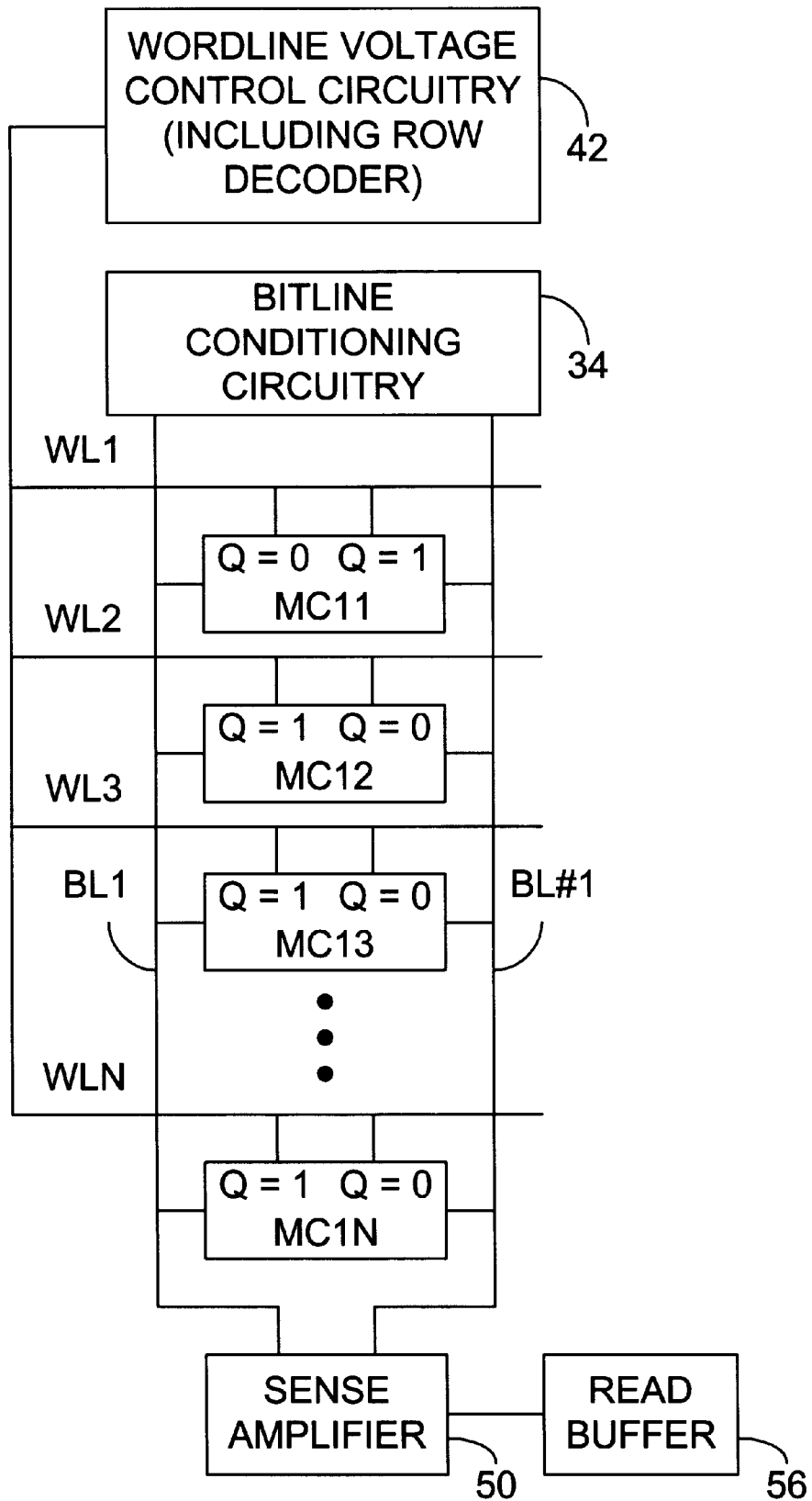
FIG. 4 is a schematic representation of a memory cell column of the memory system of FIG. 3.

The worse case condition is illustrated in FIG. 4, which schematically illustrates the states of Q and Q# for first column 24 of FIG. 3 in which for memory cell MC11, Q is low and Q# is high, but for memory cells MC12, MC13, . . . MC1N, Q is high and Q# is low. In the example of FIG. 4, wordline WL 1 is selected and wordlines WL2, WL3, . . . VWLN are not selected. In memory cells MC12, MC13, . . . MC1N, all storage nodes Q# are low and will result in leakage with respect to the bitline#. Therefore, despite the fact that the bitline is discharging faster (due to lower Vt pass transistors), without a leakage reduction technique of the invention, the leakier BL# may prevent the differential sense amplifier to build up the required sensing voltage quickly.

In some embodiments, the problem is solved by underdriving gates of the pass transistors (M5 and M6) of each memory cell that is not selected. This may be accomplished by wordline voltage control circuitry 42 underdriving the wordline signals that are not selected instead of providing them at Vss. In some embodiments, the non-selected wordlines may be at about −100 to −200 millivolts (mV) instead of at Vss. Other voltages of underdriving may be selected. As used herein, "slightly underdriving" means underdriving the wordline signals at between −5 and −99 millivolts, inclusive, with respect to ground. "Moderately underdriving" means providing the wordline signals at between −100 and −200 mV, inclusive, with respect to ground. "Strongly underdriving" means providing wordline signals at between −201 and −500 mV, inclusive, with respect to ground, and "very strongly underdriving" means providing wordline signals at more negative than −500 mV, with respect to ground.

As an example, in the case of FIG. 4, wordline WL1 may be at a logic high value (e.g., Vcc) and wordlines WL2, WL3, . . . WLN may be at about −100 to −200 mV. In some embodiments, applying a −100 to −200 mV underdrive to the gates of nMOSFET transistors, reduces the leakage by greater than an order of magnitude. This is effectively the equivalent of increasing the threshold voltage of the leaky pass transistors (e.g., by reverse body bias). A body bias adjustment, rather than underdriving may be used. For example, the memory cell being selected may have one body bias (e.g., a forward body bias), while the memory cells not selected may have another body bias (e.g., a reverse body bias). The optimum amount of wordline underdriving may comprehend gate induced drain leakage (GIDL) and other junction leakage mechanisms such as band to band tunneling (BTBT). The result of proper underdriving is a significant speed increase in sensing which overcomes the leakage of the pass transistors M5 and M6. Underdriving lowers sub-threshold leakage of transistors.

Although the illustrated embodiments include enhancement mode transistors, depletion mode transistors could be used.

There may be additional cells that are different from the cells described herein. The cells may be multiported.

In some embodiments and some situations, the bit lines of more than one column may be precharged and sensed at the same time; and/or more than one wordline signal could be asserted at the same time.

There may be intermediate structure (such as a buffer) or signals between two illustrated structures or within a structure (such as a conductor) that is illustrated as being continuous. The borders of the boxes in the figures are for illustrative purposes and not intended to be restrictive.

If the specification states a component, feature, structure, or characteristic "may", "might", or "could" be included, that particular component, feature, structure, or characteristic is not required to be included.

Those skilled in the art having the benefit of this disclosure will appreciate that many other variations from the foregoing description and drawings may be made within the scope of the present invention. Accordingly, it is the following claims including any amendments thereto that define the scope of the invention.

What is claimed is:

1. An integrated circuit comprising:
    a bitline and a bitline#;
    wordlines;
    memory cells each corresponding to one of the wordlines and each including:
        (a) first and second pass transistors coupled between first and second storage nodes, respectively, and the bitline and bitline#, respectively, the corresponding wordline being coupled to gates of the first and second pass transistors; and
        (b) first and second inverters cross-coupled between the first and second storage nodes, wherein the first and second pass transistors each have a lower threshold voltage than do transistors of the first and second inverters; and
    wordline voltage control circuitry coupled to the wordlines to selectively control wordline signals on the wordlines.

2. The integrated circuit of claim 1, wherein the wordline voltage control circuitry asserts the wordline signal for a selected wordline corresponding to a memory cell selected to be read and underdrives the wordline signals for the wordlines not corresponding to the selected memory cell.

3. The integrated circuit of claim 2, wherein the wordline signals for the wordlines not selected are at between −5 and −99 millivolts, inclusive.

4. The integrated circuit of claim 2, wherein the wordline signals for the wordlines not selected are at between −100 and −200 millivolts, inclusive.

5. The integrated circuit of claim 2, wherein the wordline signals for the wordlines not selected are at between −201 and −500 millivolts, inclusive.

6. The integrated circuit of claim 2, wherein the wordline signals for the wordlines not selected are at more than −500 millivolts.

7. The integrated circuit of claim 1, wherein the transistors are MOSFET transistors.

8. The integrated circuit of claim 1, further comprising a second column of memory cells.

9. The integrated circuit of claim 1, further comprising a sense amplifier coupled to the bitline and bitline#.

10. The integrated circuit of claim 1, further comprising bitline conditioning circuitry to precharge data and data # signals on the bitline and bitline#, respectively.

11. An integrated circuit comprising:
    a bitline and a bitline#;
    wordlines corresponding to rows;
    memory cells each corresponding to one of the wordlines and each including:
        (a) first and second pass transistors coupled between first and second storage nodes, respectively, and the bitline and bitline#, respectively, the corresponding wordline being coupled to gates of the first and second pass transistors; and
        (b) first and second inverters cross-coupled between the first and second storage nodes, wherein the first and second pass transistors each have a lower threshold voltage than do transistors of the first and second inverters; and
    wordline voltage control circuitry coupled to the wordlines to selectively control wordline signals on the wordlines, such that the wordline voltage control circuitry asserts the wordline signal for the wordline of a selected row and underdrives the wordline signals for the wordlines of rows that are not selected.

12. The integrated circuit of claim 11, wherein the wordline signals for the wordlines not selected are at between −5 and −99 millivolts, inclusive.

13. The integrated circuit of claim 11, wherein the wordline signals for the wordlines not selected are at between −100 and −200 millivolts, inclusive.

14. The integrated circuit of claim 11, wherein the wordline signals for the wordlines not selected are at between −201 and −500 millivolts, inclusive.

15. The integrated circuit of claim 11, wherein the wordline signals for the wordlines not selected are at more negative than −500 millivolts.

16. The integrated circuit of claim 11, wherein the wordlines signals for the wordlines not selected are more than negative than −100 millivolts.

17. The integrated circuit of claim 11, further comprising a second column of memory cells.

18. An integrated circuit comprising:
    a bitline and a bitline#;
    wordlines corresponding to rows;
    memory cells each corresponding to one of the wordlines and each including:
        (a) first and second pass transistors coupled between first and second storage nodes, respectively, and the bitline and bitline#, respectively, the corresponding wordline being coupled to gates of the first and second pass transistors; and
        (b) first and second inverters cross-coupled between the first and second storage nodes; and
    wordline voltage control circuitry coupled to the wordlines to selectively control wordline signals on the wordlines, such that the wordline voltage control circuitry asserts the wordline signal for the wordline of a selected row and underdrives the wordline signals for the wordlines of rows that are not selected.

19. The integrated circuit of claim 18, wherein the wordline signals for the wordlines not selected are at between −100 and −200 millivolts, inclusive.

20. A method of reading a memory cell in a column of memory cells, the method comprising:

precharging voltages for data and data# signals on a bitline and bitline#, respectively;

asserting a wordline signal in wordline corresponding to the memory cell, wherein the memory cell includes pass transistors and latch transistors and wherein the pass transistors have a lower threshold voltage than do the latch transistors; and underdriving wordline signals in wordlines that do not correspond to the memory cell selected to be read.

21. The integrated circuit of claim 20, wherein the wordline signals for the wordlines not selected are at between −5 and −99 millivolts, inclusive.

22. The integrated circuit of claim 20, wherein the wordline signals for the wordlines not selected are at between −100 and −200 millivolts, inclusive.

23. The integrated circuit of claim 20, wherein the wordline signals for the wordlines not selected are more negative than −201 millivolts.

24. The integrated circuit of claim 20, wherein the wordline signals for the wordlines not selected are at more than −500 millivolts.

* * * * *

UNITED STATES PATENT AND TRADEMARK OFFICE
CERTIFICATE OF CORRECTION

PATENT NO. : 6,181,608 B1 Page 1 of 1
DATED : January 30, 2001
INVENTOR(S) : Keshavarzi et al.

It is certified that error appears in the above-identified patent and that said Letters Patent is hereby corrected as shown below:

Column 5,
Line 54, delete "MS", insert -- M5 --.

Column 6,
Line 1, delete "MS", insert -- M5 --.
Line 11, delete "MS", insert -- M5 --.
Line 36, delete "VWLN", insert -- WLN --.

Signed and Sealed this

Fourth Day of June, 2002

Attest:

Attesting Officer

JAMES E. ROGAN
Director of the United States Patent and Trademark Office